United States Patent
Grodzki

(10) Patent No.: US 10,267,885 B2
(45) Date of Patent: Apr. 23, 2019

(54) METHOD AND APPARATUS FOR MAGNETIC RESONANCE IMAGING

(71) Applicant: Siemens Aktiengesellschaft, Munich (DE)

(72) Inventor: David Grodzki, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 609 days.

(21) Appl. No.: 14/882,793

(22) Filed: Oct. 14, 2015

(65) Prior Publication Data
US 2016/0103196 A1    Apr. 14, 2016

(30) Foreign Application Priority Data
Oct. 14, 2014  (DE) .................... 10 2014 220 776

(51) Int. Cl.
*G01R 33/565* (2006.01)
*G01R 33/00* (2006.01)
(Continued)

(52) U.S. Cl.
CPC ... *G01R 33/56536* (2013.01); *G01R 33/5659* (2013.01); *G01R 33/56563* (2013.01);
(Continued)

(58) Field of Classification Search
CPC .......... G01R 33/5659; G01R 33/56572; G01R 33/56563; G01R 33/56536;
(Continued)

(56) References Cited

U.S. PATENT DOCUMENTS 5,154,178 A * 10/1992 Shah .................... G01R 33/28
324/318
5,289,127 A * 2/1994 Doddrell .......... G01R 33/56518
324/309
(Continued)

FOREIGN PATENT DOCUMENTS

WO  9930187 A1  6/1999
WO  2009020717 A1  2/2009

OTHER PUBLICATIONS

Ma et al., Magnetic Resonance Fingerprinting, Mar. 14, 2013. NIH.*
(Continued)

*Primary Examiner* — Patrick Assouad
*Assistant Examiner* — Sean Curtis
(74) *Attorney, Agent, or Firm* — Schiff Hardin LLP

(57) ABSTRACT

To enable improved magnetic resonance imaging in the vicinity of an interference object that produces a magnetic interference field in an examination region, in a method and apparatus for magnetic resonance imaging of the examination region magnetic resonance raw data are acquired from the examination region by execution of a magnetic resonance sequence having multiple repetition intervals and refocusing of spins in the examination region at the end of each repetition interval repetition intervals. During at least part of the duration of the acquisition of the magnetic resonance raw data, a magnetic compensation gradient is activated that is opposed to the magnetic interference field.

13 Claims, 3 Drawing Sheets

(51) Int. Cl.
*G01R 33/025* (2006.01)
*G01R 33/387* (2006.01)
*G01R 33/389* (2006.01)

(52) U.S. Cl.
CPC .... *G01R 33/56572* (2013.01); *G01R 33/0017* (2013.01); *G01R 33/025* (2013.01); *G01R 33/387* (2013.01); *G01R 33/389* (2013.01)

(58) Field of Classification Search
CPC .............. G01R 33/0017; G01R 33/025; G01R 33/387; G01R 33/389
USPC .................................................. 324/300–322
See application file for complete search history.

(56) References Cited

U.S. PATENT DOCUMENTS

| | | | | |
|---|---|---|---|---|
| 5,450,010 A | * | 9/1995 | Van Der Meulen | G01R 33/56518 324/309 |
| 5,455,512 A | * | 10/1995 | Groen | G01R 33/56518 324/309 |
| 5,572,124 A | * | 11/1996 | Bito | G01R 33/4828 324/307 |
| 5,614,827 A | * | 3/1997 | Heid | G01R 33/3875 324/319 |
| 6,150,815 A | * | 11/2000 | Janzen | B82Y 25/00 324/307 |
| 6,737,865 B2 | * | 5/2004 | Asano | G01R 33/56518 324/307 |
| 6,842,000 B2 | * | 1/2005 | Norris | G01R 33/56509 324/309 |
| 6,891,373 B2 | * | 5/2005 | Deimling | G01R 33/56341 324/307 |
| 7,034,537 B2 | * | 4/2006 | Tsuda | G01R 33/3815 324/307 |
| 7,218,110 B2 | * | 5/2007 | Zhang | G01R 33/56341 324/307 |
| 7,514,927 B2 | * | 4/2009 | Herzka | G01R 33/4835 324/309 |
| 7,567,081 B2 | * | 7/2009 | Bieri | G01R 33/286 324/300 |
| 7,683,614 B2 | * | 3/2010 | Posse | G01R 33/485 324/307 |
| 7,834,625 B2 | * | 11/2010 | Doyle | G01R 33/5614 324/307 |
| 8,436,613 B2 | * | 5/2013 | Feiweier | G01R 33/56341 324/307 |
| 8,791,695 B2 | * | 7/2014 | Balcom | G01R 33/56518 324/303 |
| 9,220,473 B2 | * | 12/2015 | Blumhagen | G01R 33/481 |
| 9,360,542 B2 | * | 6/2016 | Reeder | G01R 33/56563 |
| 9,404,987 B2 | * | 8/2016 | Zhou | G01R 33/56572 |
| 9,513,358 B2 | * | 12/2016 | Levin | G01R 33/56509 |
| 9,689,952 B2 | * | 6/2017 | Popescu | G01R 33/56563 |
| 10,012,715 B2 | * | 7/2018 | Grodzki | A61B 5/055 |
| 2005/0270027 A1 | | 12/2005 | Truong et al. | |
| 2007/0052417 A1 | * | 3/2007 | Zhang | G01R 33/56341 324/309 |
| 2007/0194788 A1 | | 8/2007 | Pines et al. | |
| 2009/0174404 A1 | * | 7/2009 | Doyle | G01R 33/5613 324/307 |
| 2011/0012595 A1 | | 1/2011 | Grodzki | |
| 2011/0031971 A1 | | 2/2011 | Deimling et al. | |
| 2011/0115487 A1 | * | 5/2011 | Grodzki | A61B 5/0515 324/309 |
| 2012/0235678 A1 | | 9/2012 | Seiberlich et al. | |
| 2013/0197349 A1 | * | 8/2013 | Blumhagen | G01R 33/481 600/411 |
| 2013/0265047 A1 | | 10/2013 | Griswold et al. | |
| 2014/0077802 A1 | * | 3/2014 | Bachschmidt | G01R 33/4828 324/307 |
| 2014/0210471 A1 | * | 7/2014 | Stemmer | G01R 33/56554 324/309 |
| 2014/0225610 A1 | * | 8/2014 | Popescu | G01R 33/56563 324/309 |
| 2014/0266195 A1 | * | 9/2014 | Levin | G01R 33/56509 324/309 |
| 2015/0268322 A1 | * | 9/2015 | Paul | G01R 33/34 324/309 |
| 2015/0285878 A1 | * | 10/2015 | Gonen | G01R 33/485 324/309 |
| 2015/0293198 A1 | * | 10/2015 | Grodzki | A61B 5/055 324/309 |
| 2015/0362576 A1 | * | 12/2015 | Jurrissen | G01R 33/445 324/309 |
| 2016/0033602 A1 | * | 2/2016 | Fritz | G01R 33/4816 324/309 |
| 2016/0103196 A1 | * | 4/2016 | Grodzki | G01R 33/56536 324/309 |
| 2016/0131727 A1 | * | 5/2016 | Sacolick | G01R 33/445 324/318 |
| 2017/0227621 A1 | * | 8/2017 | Hirai | G01R 33/387 |
| 2017/0248672 A1 | * | 8/2017 | Feiweier | G01R 33/443 |

OTHER PUBLICATIONS

Ma et al., Magnetic Resonance Fingerprinting, Mar. 14, 2013. NIH. (Year: 2013).*

Ma et al., "Magnetic Resonance Fingerprinting," Nature, vol. 495 (7440), pp. 187-192 (2013).

* cited by examiner

METHOD AND APPARATUS FOR MAGNETIC RESONANCE IMAGING

BACKGROUND OF THE INVENTION

Field of the Invention

The invention concerns a method for magnetic resonance imaging, a magnetic resonance apparatus and a computer-readable data storage medium.

Description of the Prior Art

In a magnetic resonance apparatus, also called a magnetic resonance tomography system, the body to be examined of an examination subject, in particular a patient, is conventionally exposed with the use of a basic field magnet to a relatively high basic magnetic field, for example of 1.5 or 3 or 7 tesla. In addition, gradient switching operations occur with a gradient coil unit. Radio-frequency pulses, in particular excitation pulses, are then emitted by a radio-frequency antenna unit via suitable antennas, and this leads to the nuclear spins (spins) of specific atoms excited in a resonant manner by these radio-frequency pulses being tilted by a defined flip angle with respect to the magnetic field lines of the basic magnetic field. When the spins are relaxed, radio-frequency signals, known as magnetic resonance signals, are emitted from the spins, and these are received by a suitable radio-frequency antenna, and then processed further. The desired image data can be reconstructed from the raw data acquired in this way.

For a specific scan a specific magnetic resonance sequence, also called a pulse sequence, should be emitted, which includes a series of radio-frequency pulses, in particular radio-frequency excitation pulses, and gradient switching operations, which are activated in appropriate coordination with the radio-frequency pulses along different gradient axes in different spatial directions. Readout windows that are appropriately timed are set, which specify the periods in which the induced magnetic resonance signals are detected.

An interference object may be present in an examination region of a magnetic resonance recording. This interference object is characterized by having a magnetic susceptibility that differs from the magnetic susceptibility of tissue surrounding the interference object. This interference object therefore can lead to magnetic interference fields that can make imaging of the interference object difficult and/or lead to image artifacts in the vicinity of the interference object.

SUMMARY OF THE INVENTION

An object of the invention is to enable improved magnetic resonance imaging in the vicinity of an interference object.

According to the invention, in a method for acquiring magnetic resonance raw data from an examination region of an examination object by operation of a magnetic resonance scanner, wherein an interference object is situated in the examination region that causes a magnetic interference field during magnetic resonance data acquisition, magnetic resonance raw data are acquired from the examination region by execution of a magnetic resonance sequence having multiple repetition intervals with refocusing of nuclear spins in the examination region at the end of each repetition interval, and wherein, during at least part of the duration of acquisition of the magnetic resonance raw data, a magnetic compensation gradient is activated that is opposed to the magnetic interference field.

The examination object can be a patient, a trainee or a phantom. The examination region, also called the field of view (FOV) is a volume of which an image is to be reconstructed from the acquired raw magnetic resonance data. The reconstructed magnetic resonance image is presented, i.e. displayed on a display monitor for a user and/or stored in a database. In either case, the raw data are compiled in a datafile in a memory during acquisition thereof, and the image data are also compiled in a datafile.

The interference object has a magnetic susceptibility that differs from the magnetic susceptibility of the material that surrounds the interference object. The interference object in particular has a magnetic susceptibility that is different from the magnetic susceptibility of surrounding tissue of the examination object in the examination region. In particular, the magnetic susceptibility of the interference object is higher than, often more than ten times higher than, the magnetic susceptibility of the material that surrounds the interference object. The interference object can include metal. The interference object can be, for example, a metallic implant in the examination object, such as an artificial hip joint.

The magnetic interference field of the interference object is produced due to the difference of the susceptibility of the interference object from the surrounding material. The magnetic interference field can have a magnetic field gradient. The magnetic interference field therefore can lead to at least one additional gradient moment being present during acquisition of the raw data. The magnetic interference field of the interference object therefore can disrupt the nuclear spins that are excited during the magnetic resonance raw data acquisition. The magnetic interference field typically disrupts a phase development and/or a phase position of the spins. This can mean that the excited spins are dephased due to the magnetic interference field, in particular drift apart. In this way the interference object can lead to a signal loss in the recorded magnetic resonance raw data in a vicinity of the interference object. In this way the magnetic interference field can disrupt refocusing of the spins.

The multiple repetition intervals in the magnetic resonance sequence will each have a duration of one repetition time. The repetition time is typically defined as the duration that occurs between two radio-frequency excitation pulses of the magnetic resonance sequence. The magnetic resonance sequence is advantageously designed as a single-shot magnetic resonance sequence. This means that the magnetic resonance raw data produce a number of magnetic resonance images. In each repetition interval among the multiple repetition intervals, raw data are acquired for reconstruction of one magnetic resonance image among the multiple magnetic resonance images. The respective sets of raw data for the multiple magnetic resonance images are acquired consecutively, within a portion of each repetition time.

In the case of a spin echo magnetic resonance sequence, the spins can be refocused by a radio-frequency refocusing pulse. In the case of a gradient echo magnetic resonance sequence, the spins can be refocused by a refocusing gradient switching operation, also called refocusing gradient. The refocusing gradient is switched in the phase encoding direction. Refocusing of the spins leads to a defined starting position (angle) of the spins at the beginning of a repetition interval. Refocusing of the spins conventionally involves refocusing dephased spins. Refocusing of the spins may also include a different change in the phase position of the spins.

The magnetic interference field of the interference object can disrupt this refocusing of the spins. To compensate the magnetic interference field at least partially, the compensation gradient in accordance with the invention is activated. The magnetic compensation gradient is switched by the gradient coils that are conventionally present in the magnetic resonance scanner. The compensation gradient is designed as a magnetic gradient field. The compensation gradient is switched with the spatial encoding gradients in an overlaid manner, these spatial encoding gradients already being present in the magnetic resonance sequence. The compensation gradient may also be switched in an overlaid manner on a refocusing gradient. The compensation gradient is therefore switched (activated) in addition to the spatial encoding gradient and/or the refocusing gradient. The fact that the magnetic compensation gradient is opposed to the magnetic interference field means that there is an increase in the magnetic compensation gradient in a direction that is opposite to the direction of increase in the magnetic interference field. The gradient moment of the compensation gradient is also designed so as to be opposed to the gradient moment of the magnetic interference field. The gradient moment is typically defined by the time integral of the amplitude of a gradient switching operation.

Interference to the refocusing of the spins due to the magnetic interference field can be at least partially prevented by the approach according to the invention. The compensation gradient can ensure that the spins are more correctly refocused at the end of each repetition interval of the multiple repetition intervals. Thus there can be a macro-defined starting point for a phase position of the spins at the beginning of the multiple repetition intervals. The raw data for each magnetic resonance image among the multiple magnetic resonance images thus are acquired, in each repetition interval of the multiple repetition intervals, on a comparable basis and/or under standardized boundary conditions. In this way magnetic resonance imaging can be carried out particularly effectively in the vicinity of the interference object. It is also possible for artifact-reduced magnetic resonance image data to be generated with the method according to the invention. In particular in the immediate vicinity of the interference object, the tissue of the examination object can be correctly shown in the magnetic resonance image data.

A number of sets of magnetic resonance raw data from the examination region can be acquired in a number of magnetic resonance scans. A different compensation gradient can then be switched during each raw data set acquisition to compensate a different magnetic interference field. A first set of magnetic resonance raw data therefore can be acquired in a first magnetic resonance scan using a first compensation gradient that compensates a first magnetic interference field, and in a second magnetic resonance scan, a second set of magnetic resonance raw data can be acquired using a second compensation gradient that compensates a second magnetic interference field. Different interference fields, which are caused by one or more interference object(s) in the examination region, can thereby be particularly accurately compensated.

In an embodiment, the magnetic compensation gradient is switched such that interference, caused by the magnetic interference field, to the refocusing of the spins in the examination region is at least partially compensated. For this purpose, the gradient moment of the magnetic compensation gradient is chosen such that the gradient moment of the magnetic interference field is at least partially compensated. This can ensure extensive, possibly complete, refocusing of the spins in the examination region. The extensive, in particular complete, refocusing of the spins is then present at the beginning of each repetition interval of the multiple repetition intervals.

In another embodiment, the compensation gradient is switched for the entire duration of acquisition of the magnetic resonance raw data. In particular, the compensation gradient is then switched for the entire repetition interval. In this way a disruptive gradient moment of the magnetic interference field can be reliably compensated throughout the entire recording of the magnetic resonance image data.

In another embodiment, the compensation gradient is switched during refocusing of the spins in the examination region at the end of each repetition interval of the multiple repetition intervals. The compensation gradient is therefore advantageously switched only if refocusing of the spins occurs. The compensation gradient is therefore advantageously activated in precisely that period during which refocusing of the spins occurs. The compensation gradient is switched only at the end of each repetition interval. It is advantageous to switch the compensation gradient selectively during refocusing because a dephasing of spins, produced by the compensation gradient, which are not affected by the magnetic interference field, can therefore be at least partially prevented and/or reduced. The compensation gradient thus can advantageously be matched to the requirements for refocusing of the spins.

In another embodiment, refocusing of the spins in the examination region includes refocusing of a gradient-induced phase development of the spins in the examination region by a refocusing gradient, and the compensation gradient is switched during the refocusing gradient in addition to the refocusing gradient. The refocusing gradient is switched in the phase encoding direction, so the gradient-induced phase development of the spins can be refocused. The compensation gradient is then switched in addition to the refocusing gradient, so the interference in the phase development of the spins, caused by the interference object, can be at least partially compensated. This approach is based on the concept that the refocusing gradient is typically fixed by the magnetic resonance sequence. The refocusing gradient therefore typically cannot be variably adjusted to the presence of the interference object in the examination region. The compensation gradient can then advantageously take on this task. The compensation gradient can modulate the refocusing gradient so an optimum refocusing of the spins in the examination region can be attained, while taking account of the magnetic interference field of the interference object. The refocusing gradient and the compensation gradient are switched in an overlaid manner by the gradient coil, so an effective compensation-refocusing gradient switching operation is carried out at the end of each repetition interval of the multiple repetition intervals.

In another embodiment, parameters of the compensation gradient are ascertained as a function of parameters of the refocusing gradient. Parameters of a gradient switching operation can be, for example, the amplitude of the gradient switching operation, the duration of the gradient switching operation, the slew rate of the gradient switching operation, etc. Further parameters of the gradient switching operation that sre4 considered expedient by those skilled in the art are also conceivable. The compensation gradient can be advantageously matched to the refocusing gradient by ascertaining the parameters of the compensation gradient as a function of the parameters of the refocusing gradient. The spins in the examination region can be particularly effectively refocused in this way.

In another embodiment, the magnetic resonance sequence is a steady-state free precession (SSFP) magnetic resonance sequence. An SSFP magnetic resonance sequence typically includes a sequence of radio-frequency excitation pulses with the condition that the repetition time, i.e. the duration of a repetition interval, is less than the T2 relaxation time of the relevant tissue of the examination object. The radio-frequency excitation pulses are therefore switched in an interval, the repetition time, which is smaller than the T2 time. Magnetization of the spins in the steady state can therefore develop. SSFP magnetic resonance sequences are typically very sensitive to different phase positions of spins at the beginning of a repetition time. In the case of SSFP magnetic resonance sequences, it may therefore be expedient to carry out refocusing of the phase development of the spins at the end of the repetition intervals. The steady state can develop particularly reliably in this way. In this way the inventive approach, which ensures correct refocusing of the spins, is particularly advantageous so that artifact-free and strong-signal magnetic resonance data can be acquired and reconstructed by an SSFP magnetic resonance sequence in vicinity of an interference object.

In another embodiment, the magnetic resonance raw data are recorded by a quantitative magnetic resonance method. A quantitative magnetic resonance method, which is used to acquire the magnetic resonance image data, is used in particular for determining at least one quantitative material parameter. The at least one material parameter is quantified in particular in a spatially resolved manner. A spatially resolved distribution of the at least one material parameter is therefore quantified. The at least one material parameter advantageously characterizes a physical property of the material, for example of the tissue, from which the magnetic resonance signals originate. In particular, the at least one material parameter can quantify a reaction of the material to the radio-frequency excitation. A choice of potential material parameters, which can be quantified in the quantitative magnetic resonance method, is: T1 relaxation time, T2 relaxation time, a diffusion value (for example an apparent diffusion coefficient, ADC), a magnetization moment, the proton density, the resonance frequency, a concentration of a material, etc. Further material parameters that are considered expedient to those skilled in the art are also conceivable. Any combination of the material parameters can be determined in the quantitative magnetic resonance method. A quantitative magnetic resonance method advantageously enables quantification of the at least one material parameter, which is, for example, independent of scan conditions or type of magnetic resonance device. The quantification of the at least one material parameter therefore can be independent of parameter settings, adjustment scans, coil intensities, software versions, etc. A quantitative magnetic resonance image, reconstructed from the magnetic resonance raw data acquired in the quantitative magnetic resonance method, can therefore contain information about absolute physical variables. The value of an image pixel of a quantitative magnetic resonance image of this kind therefore advantageously has a direct correlation with a physical measured value. The value of an image pixel can have a physical unit. Therefore magnetic resonance images, respectively reconstructed from raw data acquired with different quantitative magnetic resonance methods, and potentially under different scan conditions, can advantageously be directly compared with each other. It is precisely in a quantitative magnetic resonance method that it is important to use a defined magnetic resonance sequence, since absolute physical variables are to be determined. A disrupted phase position of spins in a quantitative magnetic resonance method can lead to a falsification of the quantitative values of the at least one material parameter. Therefore, it is specifically in a quantitative magnetic resonance method, which uses refocusing of the spins, that it is important for the refocusing of the spins to occur correctly. The inventive method can ensure this if it is used in combination with recording of quantitative magnetic resonance image data. Comparability of the quantitative magnetic resonance image data therefore can be ensured. It can also be ensured that the material parameters are correctly quantified in the quantitative magnetic resonance image data. In this way, exact quantitative magnetic resonance imaging is also possible in the vicinity of the interference object.

In another embodiment, the quantitative magnetic resonance method is a magnetic resonance fingerprinting method, wherein, during each repetition interval of the multiple repetition intervals, data for a magnetic resonance image are acquired and a magnetic resonance signal characteristic is generated from the magnetic resonance images generated in this way. A signal comparison of the generated magnetic resonance signal characteristic takes place with a number of database signal characteristics stored in a database. One possible magnetic resonance fingerprinting method is known, for example, from Ma et al., "Magnetic Resonance Fingerprinting", Nature, 495, 187-192 (14 Mar. 2013). In a magnetic resonance fingerprinting method various recording parameters are typically set for acquiring raw data for the magnetic resonance images. For each magnetic resonance image among the multiple magnetic resonance images detecting a number of spatially resolved magnetic resonance signal values are detected. These signal values are present in the image region of an examination region. The signal values are not present in k-space. The magnetic resonance images are typically not intended to be made available, for example on a display monitor. The recording parameters can be varied during detection of the multiple magnetic resonance images in a pseudo-randomized manner. Possible recording parameters, which are changed during the acquisition of the multiple magnetic resonance images, are echo time, the configuration and/or number of radio-frequency pulses, the configuration and/or number of gradient pulses, a diffusion encoding, etc. A spatially-dependent magnetic resonance signal characteristic is then typically generated by the multiple magnetic resonance images. The magnetic resonance signal characteristic therefore indicates a change in recorded magnetic resonance signal values over the duration of detection of the magnetic resonance signal characteristic. A time resolution of the magnetic resonance signal characteristic is formed by an interval between detection of two magnetic resonance images of the multiple magnetic resonance images, i.e. by the duration of a repetition interval. This magnetic resonance signal characteristic is then typically compared in a signal comparison with a number of database signal characteristics stored in a database. A different database value respectively of at least one material parameter is respectively allocated to the different database signal characteristics. The database signal characteristic then constitutes the signal characteristic that is to be expected in the magnetic resonance fingerprinting method a sample is being examined, whose material properties match those of the associated database value of the at least one material parameter. The database signal characteristics can be ascertained, for example, in a calibration scan and/or can be simulated. In such a magnetic resonance fingerprinting method, typically a database signal characteristic of the multiple database signal characteristics is allocated to the generated magnetic resonance signal characteristic, using the result of the signal comparison. The database value pertaining to the associated database signal characteristic of the at least one material parameter can then be set as the scan value of the at least one material parameter. For detecting the magnetic resonance images according to the magnetic resonance fingerprinting method, it is typically necessary that the spins are refocused in the examination region at the end of each repetition interval. If this refocusing is disrupted by the presence of the interference object, a magnetic resonance signal characteristic detected in the vicinity of the interference object can be disrupted. Errors can consequently occur in the allocation of the magnetic resonance signal characteristic detected in vicinity of the interference object to the database signal characteristics. The reason for this is that interference to the refocusing of the spins by an interference object is typically not taken into account in the database signal characteristics. The presence of the interference object can therefore lead to errors in the quantification of the material parameters by the magnetic resonance fingerprinting method. The proposed compensation gradient can therefore ensure that the spins for the magnetic resonance fingerprinting method are correctly refocused at the end of each repetition interval. In this way the magnetic resonance signal characteristics can be correctly allocated to database signal characteristics and therefore the at least one material parameter can be correctly quantified by the magnetic resonance fingerprinting method in the vicinity of the interference object.

In another embodiment before acquiring the magnetic resonance raw data, adjustment data are detected, and parameters of the magnetic compensation gradient are ascertained using the adjustment data. The adjustment data can be used to identify inhomogeneities in the basic magnetic field, particularly after the examination object is positioned in the magnetic resonance scanner. Methods for detecting the adjustment data are known to those skilled in the art so such methods need not be discussed in detail herein. In particular, a gradient moment of the magnetic compensation gradient can be ascertained using the adjustment data. The gradient moment of the compensation gradient can be adjusted so as to be higher, the greater the inhomogeneity of the basic magnetic field is. The adjustment data can therefore indirectly provide a conclusion about the magnetic interference field to be expected in the magnetic resonance imaging, which is caused by the interference object. The adjustment data therefore represent a particularly advantageous starting point, using which the parameters of the magnetic compensation gradient can be set. For example, before acquiring the magnetic resonance raw data, a B0 field map of the examination region can be detected, with parameters of the magnetic compensation gradient being ascertained using the B0 field map. A B0 field map represents the field distribution of a main magnetic field of the magnetic resonance device. The B0 field map is proportional to the basic magnetic field (B0 field) of the magnetic resonance device. Other adjustment data, for example frequency adjustment data, are also conceivable for ascertaining the parameters of the compensation gradient.

In another embodiment, the acquisition of the magnetic resonance raw data includes emitting radio-frequency excitation pulses with an excitation frequency, with the excitation frequency being chosen such that it matches the resonance frequency of spins in a physical environment of the interference object. This is possible since the resonance frequency of the spins is shifted in the physical environment of the interference object by the presence of the interference object. Matching the excitation frequency to the resonance frequency of the spins in the physical environment of the interference object can ensure that only the spins in the physical environment of the interference object are excited.

Therefore, the magnetic resonance image data are reconstructed solely from magnetic resonance signals that originate from spins in the physical environment of the interference object. In this way the examination region can be efficiently matched to the physical environment of the interference object. At the same time, refocusing of the spins in the physical environment of the interference object can be purposefully optimized by the magnetic compensation gradient. Thus there is no undesirable dephasing of spins that are situated at a distance from the interference object positioned, due to the compensation gradient. The magnetic resonance raw data can be acquired with the excitation frequency, which is matched to the resonance frequency of the spins in the physical environment of the interference object, as a final scan following acquisition of further magnetic resonance image data from a larger examination region, which includes the interference object. In this way, the vicinity of the interference object can again be purposefully imaged free from interference.

The invention also includes a magnetic resonance apparatus that has a scanner operated by a control computer that has an arithmetic module and a compensation gradient module configured to carry out the inventive method.

The magnetic resonance apparatus is therefore designed to carry out a method for magnetic resonance imaging an examination region of an examination object, wherein an interference object is situated in the examination region, which causes a magnetic interference field during raw magnetic resonance data acquisition. The scanner of the magnetic resonance apparatus is operates to acquire magnetic resonance raw data from the examination region by execution of a magnetic resonance sequence that includes multiple repetition intervals and refocusing of spins in the examination region at the end of each repetition interval. The compensation gradient module is configured to switch a magnetic compensation gradient that is opposed to the magnetic interference field, during at least part of the duration of the acquisition of the magnetic resonance raw data.

In an embodiment of the magnetic resonance apparatus, the compensation gradient module is designed to activate the magnetic compensation gradient so that interference, caused by the magnetic interference field, to the refocusing of the spins in the examination region is at least partially compensated.

In another embodiment of the magnetic resonance apparatus, the compensation gradient module is designed to activate the compensation gradient for the entire duration of acquisition of the magnetic resonance raw data.

In another embodiment of the magnetic resonance apparatus, the compensation gradient module is designed to activate the compensation gradient during refocusing of the spins in the examination region at the end of each repetition interval of the multiple repetition intervals.

In another embodiment of the magnetic resonance apparatus, the magnetic resonance apparatus has a refocusing gradient module that activates a refocusing gradient that refocuses the spins in the examination region by producing a gradient-induced phase development of the spins in the examination region, and the compensation gradient is activated during the refocusing gradient in addition to the refocusing gradient.

In another embodiment of the magnetic resonance apparatus, the compensation gradient module and the refocusing gradient module are designed such that parameters of the compensation gradient are ascertained as a function of parameters of the refocusing gradient.

In another embodiment of the magnetic resonance apparatus, the scanner is operated to execute, as the aforementioned magnetic resonance sequence, a steady-state free precession (SSFP) magnetic resonance sequence.

In a further embodiment of the magnetic resonance apparatus, the scanner is operated to acquire the magnetic resonance raw data by a quantitative magnetic resonance method.

In a version of this embodiment of the magnetic resonance apparatus the scanner is operated with the quantitative magnetic resonance method being a magnetic resonance fingerprinting method, wherein raw data for a magnetic resonance image are acquired during each repetition interval of the multiple repetition intervals, and a magnetic resonance signal characteristic is generated from the magnetic resonance images of the respective intervals, and a signal comparison of the generated magnetic resonance signal characteristic is made with a number of database signal characteristics stored in a database.

In another embodiment of the magnetic resonance apparatus, the magnetic resonance apparatus has an adjustment data acquisition module, wherein the adjustment data acquisition module and the compensation gradient module are designed to cause adjustment data to be acquired before acquiring the magnetic resonance raw data, and parameters of the magnetic compensation gradient are ascertained using the adjustment data.

In another embodiment of the magnetic resonance apparatus, the scanner is operated so that acquisition of the magnetic resonance raw data includes emitting radio-frequency excitation pulses with an excitation frequency, and the excitation frequency is chosen so as to match the resonance frequency of spins in a physical environment of the interference object.

The invention also encompasses a non-transitory, computer-readable data storage medium that can be loaded directly into a memory of a programmable arithmetic module of the control computer of the magnetic resonance apparatus. The storage medium is encoded with programming instructions that cause the inventive method to be executed by the arithmetic module. The inventive method can consequently be carried out quickly, robustly and in a manner that can be identically repeated. The arithmetic module has an appropriate main memory, an appropriate graphics card or an appropriate logic unit, so the respective method steps can be carried out efficiently. Examples of the electronically readable data storage medium are a DVD, a magnetic tape or a USB stick, on which electronically readable control information, in particular software, is stored.

The advantages of the inventive magnetic resonance apparatus and of the inventive storage medium correspond to the advantages of the inventive method, as discussed above in detail. Features, advantages or alternative embodiments mentioned in that context are applicable to the other aspects of the invention. The corresponding functional features of the method are implemented by appropriate modules, in particular by hardware modules.

DESCRIPTION OF THE PREFERRED EMBODIMENTS

Figure 1:
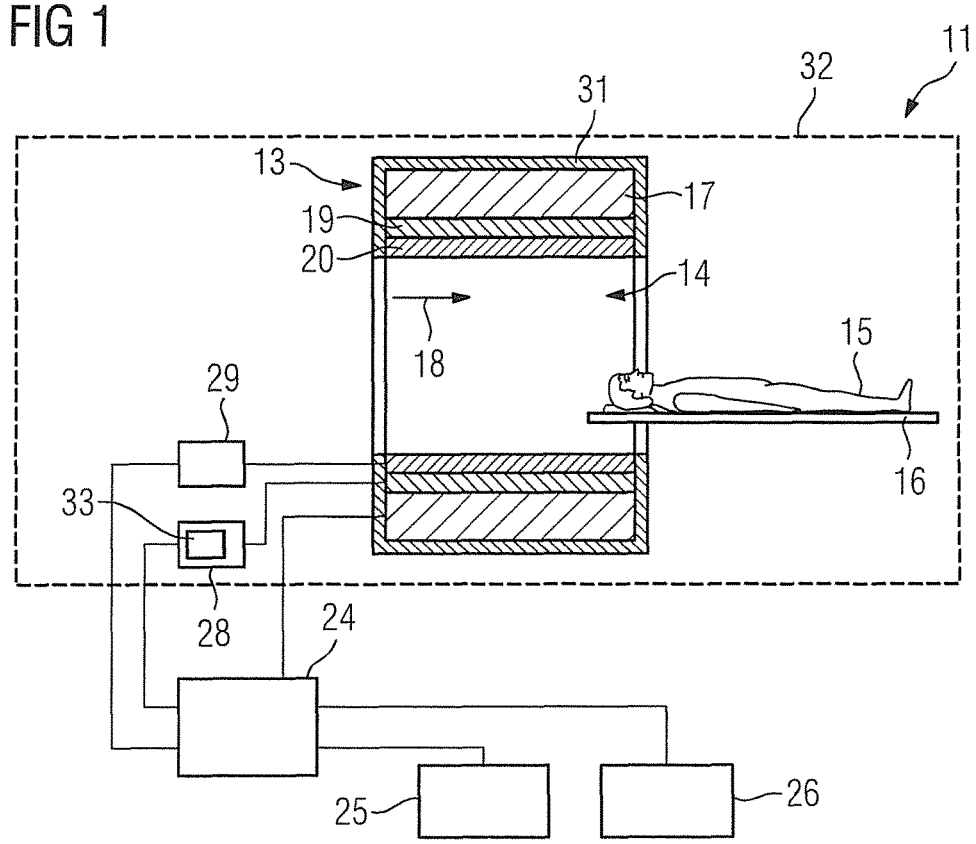
FIG. 1 schematically illustrates an inventive magnetic resonance apparatus.

FIG. 1 schematically illustrates an inventive magnetic resonance apparatus 11. The magnetic resonance apparatus 11 has a scanner formed by a magnet unit 13 that has a basic field magnet 17 for generating a strong and constant basic magnetic field 18. The scanner has a cylindrical patient-receiving region 14 for receiving an examination object 15, in the present case a patient, with the patient-receiving region 14 being cylindrically surrounded in a circumferential direction by the magnet unit 13. The patient 15 can be moved by a patient-positioning device 16 of the magnetic resonance apparatus 11 into the patient-receiving region 14. The patient-positioning device 16 has for this purpose an examination table arranged so as to move inside the scanner. The magnet unit 13 is shielded from the outside by a housing shell 31.

The magnet unit 13 also has a gradient coil unit 1 for generating magnetic field gradients which are used for spatial encoding during imaging. The gradient coil module 19 is controlled by a gradient control module 28. The magnet unit 13 also has a radio-frequency antenna unit 20, which in the illustrated case is designed as a body coil permanently integrated in the magnet unit 13, and a radio-frequency antenna control module 29 for exciting nuclear spins in the patient 15 so as to depart from the polarization that is established in the basic magnetic field 18 generated by the basic field magnet 17. The radio-frequency antenna unit 20 is controlled by a radio-frequency antenna control module 29 so as to radiate radio-frequency magnetic resonance sequences into an examination space that is formed substantially by the patient-receiving region 14. The radio-frequency antenna unit 20 is also designed to receive magnetic resonance signals from the patient 15.

For controlling the basic field magnet 17, the gradient control module 28 and the radio-frequency antenna control module 29, the magnetic resonance apparatus 11 has an arithmetic processor 24. The arithmetic processor 24 centrally controls the magnetic resonance apparatus 11, such as for example to execute a predetermined imaging gradient echo sequence. Control information such as imaging parameters, and reconstructed magnetic resonance images can be presented to a user at an interface, in the present case a display monitor 25, of the magnetic resonance apparatus 11. In addition, the magnetic resonance apparatus 11 has an input unit 26, via which information and/or parameters can be entered by a user during a scanning process. The arithmetic processor 24 can include the gradient control module 28 and/or the radio-frequency antenna control module 29 and/or the display monitor 25 and/or the input unit 26.

In the illustrated case the gradient control module 28 has a compensation gradient module 33. The magnetic resonance apparatus 11 also has an image data recording module 32. In the present case, the image data recording module 32 is formed by the magnet unit 13 together with the radio-frequency antenna control unit 29 and gradient control module 28. The magnetic resonance apparatus 11 is therefore configured, together with the image data recording module 32, arithmetic processor 24 and compensation gradient module 33, to implement an inventive method for magnetic resonance imaging.

The illustrated magnetic resonance apparatus 11 can have further components that magnetic resonance apparatuses conventionally have. The general operation of a magnetic resonance apparatus is known to those skilled in the art, so a detailed description of the further components is not necessary herein.

Figure 2:
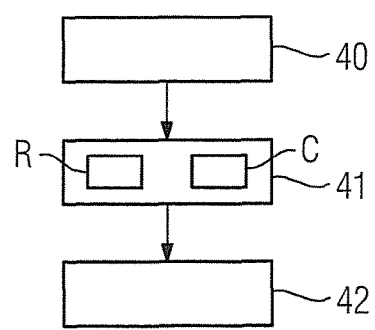
FIG. 2 is a flowchart of a first embodiment of the inventive method.

FIG. 2 is a flowchart of a first embodiment of the inventive method for magnetic resonance imaging.

In a first method step 40, a magnetic resonance sequence is conventionally chosen and prepared. This means that, typically, a user determines the type of magnetic resonance sequence by way of an input unit 26 and/or chooses an appropriate protocol in which a specific magnetic resonance sequence is defined. In a further method step 40 the examination object 15 is positioned in the magnetic resonance apparatus 11 and an examination region of the examination object 15 determined. An interference object is positioned in the examination region. This interference object causes a magnetic interference field in magnetic resonance imaging.

In a further method step 41 magnetic resonance image data is recorded by means of the image data recording module 32 of the magnetic resonance apparatus 11 from the examination region by means of the magnetic resonance sequence. The magnetic resonance sequence has multiple of repetition intervals and refocusing R of spins in the examination region at the end of each repetition interval of the plurality of repetition intervals in each case. During at least part of the duration recording of the magnetic resonance image data a magnetic compensation gradient C is also switched which is opposed to the magnetic interference field. The compensation gradient C is switched by the gradient coil module 19, wherein, for switching the compensation gradient C, the gradient coil module 19 is controlled by the compensation gradient module 33 of the gradient control module 19. The compensation gradient C is in particular switched so as to be overlaid with spatial encoding gradients provided by the magnetic resonance sequence, with the spatial encoding gradients also being switched by the gradient coil module 19.

In a further method step 42 the recorded magnetic resonance image data are displayed for a user on the display monitor 25 and/or stored in a database.

Figure 3:
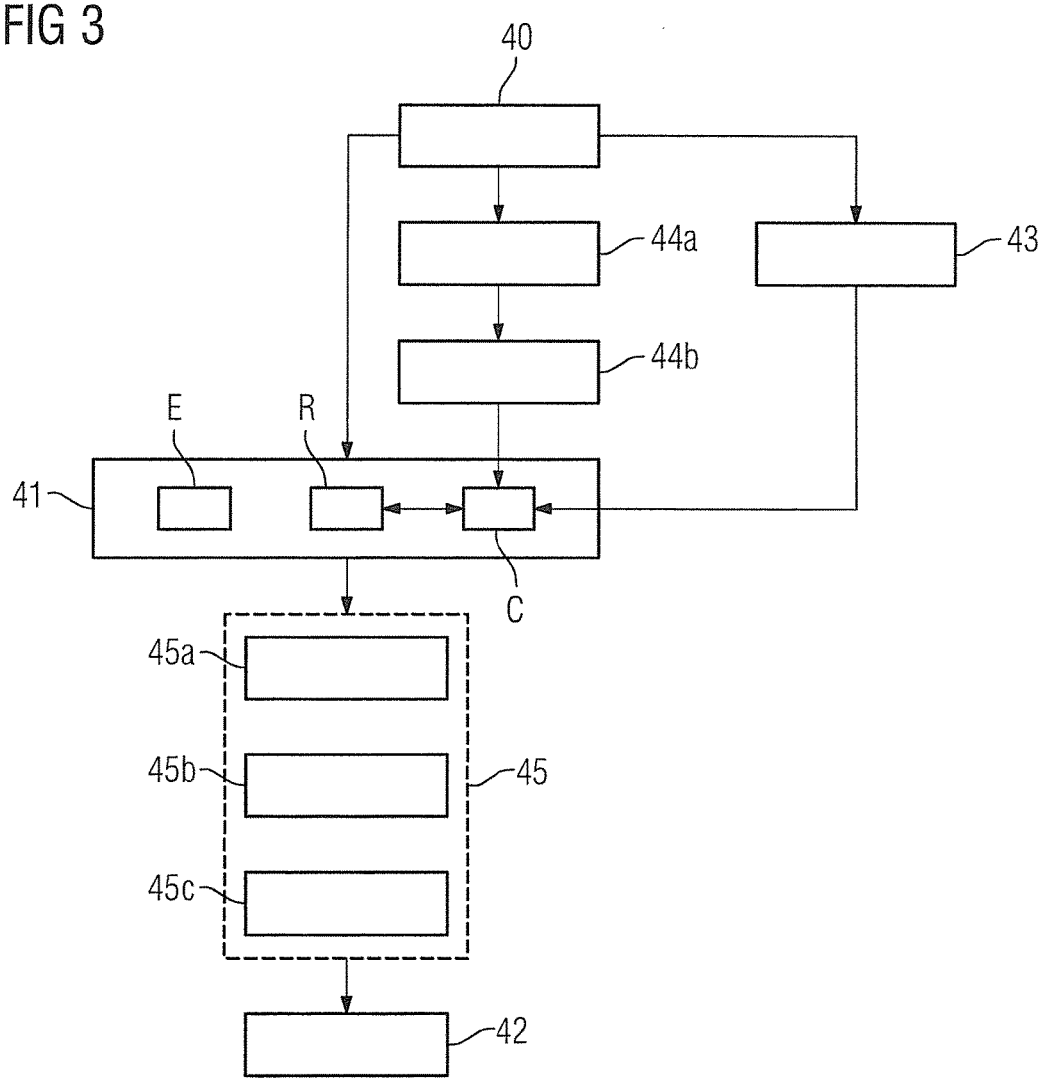
FIG. 3 is a flowchart of a second embodiment of the inventive method.

FIG. 3 is a flowchart of a second embodiment of the inventive method for magnetic resonance imaging.

The following description is substantially limited to the differences from the exemplary embodiment in FIG. 2, with reference being made to the description of the exemplary embodiment in FIG. 2 in relation to identical method steps. Method steps that are substantially the same are basically numbered with the same reference numerals.

The embodiment of the inventive method shown in FIG. 3 substantially includes the method steps 40, 41, 42 of the first embodiment of the inventive method according to FIG. 2. In addition, the embodiment of the inventive method shown in FIG. 3 has additional method steps and/or substeps. An alternative procedure to that in FIG. 3, which has only some of the additional method steps and/or substeps shown in FIG. 2, is also conceivable. Of course an alternative procedure to that in FIG. 3 can also have additional method steps and/or substeps.

The magnetic resonance sequence chosen in further method step 40 can be a steady-state free precession (SSFP) magnetic resonance sequence. However, this is just one possible magnetic resonance sequence for recording the magnetic resonance image data. Other magnetic resonance sequences can of course also be used.

The magnetic resonance sequence chosen in further method step 40 has refocusing of a gradient-induced phase development of the spins in the examination region by means of refocusing gradient R. The refocusing gradient R is switched in particular by a refocusing gradient unit of the gradient control module 28. In a further method step 43 parameters of the refocusing gradient R are read out by means of the arithmetic processor 24. These parameters of the refocusing gradient R are passed to the compensation gradient module 33. The compensation gradient module 33 ascertains parameters of the compensation gradient C in further method step 43 as a function of parameters of the refocusing gradient R. The ascertained parameters of the magnetic compensation gradient C can then be set for the compensation gradient C during recording of the magnetic resonance image data in further method step 41.

After the positioning of the examination object 15 in the magnetic resonance apparatus 11, adjustment data is in a further method step 44a by an adjustment data acquisition unit of the magnetic resonance device. For example, a B0 field map is acquired. The field map is acquired in a further method step 44a before recording of the magnetic resonance image data in further method step 41. The adjustment data is passed from the adjustment data acquisition unit to a parameter adjustment unit. In this way the parameter adjustment unit can ascertain parameters of the magnetic compensation gradient C in a further method step 44b using the detected B0 field map by the arithmetic processor 24. The ascertained parameters of the magnetic compensation gradient C can then be set for the compensation gradient C during recording of the magnetic resonance image data in a further method step 41. For this purpose, the parameters of the parameter adjustment unit are transmitted to the gradient control module 28 of the magnetic resonance apparatus 11. The gradient control module 28 can then control the gradient coil module 19 using the parameters of the magnetic compensation gradient.

In a further method step 41 the compensation gradient C is switched by means of the compensation gradient module 33 during the refocusing gradient R. The compensation gradient C can be switched throughout the entire duration of recording of the magnetic resonance image data. Alternatively, the compensation gradient C can be purposefully switched for refocusing of the spins in the examination region at the end of each repetition interval of the plurality of repetition intervals. The magnetic compensation gradient C is switched in a further method step 41 such that interference, caused by the magnetic interference field, to the refocusing of the spins is at least partially compensated in the examination region.

Recording of the magnetic resonance image data in further method step 41 by means of the image data recording module 32 also comprises emitting radio-frequency excitation pulses E with an excitation frequency, with the excitation frequency being chosen such that it matches a resonance frequency of spins in a physical environment of the interference object. In this way, an examination region can be restricted to a vicinity of the interference object by means of the radio-frequency excitation pulses E, which are emitted in particular by means of an excitation pulse unit of the magnetic resonance apparatus 11.

The magnetic resonance image data is recorded in a further method step 41, for example by a quantitative magnetic resonance method. In the case shown in FIG. 3 the quantitative magnetic resonance method is a magnetic resonance fingerprinting method. In the further method step 41 a magnetic resonance image is recorded by means of the image data recording module 32 during each repetition interval of the plurality of repetition intervals. The magnetic resonance fingerprinting method includes in particular that recording parameters that have been changed in a pseudo randomized manner are used during recording of the magnetic resonance images.

The number of magnetic resonance images recorded in this way are not displayed directly but processed further in a further method step 45 by the arithmetic processor 24. In a first substep 45*a* of the further method step 45 a magnetic resonance signal characteristic is generated from the recorded magnetic resonance images. In particular, one signal characteristic is formed by each voxel of the magnetic resonance images over the plurality of magnetic resonance images.

In a second substep 45*b* of the further method step 45 there is a signal comparison of the generated magnetic resonance signal characteristic with a number of database signal characteristics stored in a database. A database value of at least one tissue parameter is allocated to each database signal characteristic of the number of database signal characteristics. The database is connected in particular in the sense of a data exchange to the arithmetic processor 24. The magnetic resonance signal characteristic is compared by way of example with each of the database signal characteristics. The signal comparison can occur by a conventional pattern recognition method and/or by a correlation analysis. During the signal comparison a comparison parameter is then output for each comparison, and this characterizes the degree of accord between the magnetic resonance signal characteristic and the database signal characteristics.

Using the signal comparison a tissue parameter map can be created in this way in a third substep 45*c*, and this includes a spatially resolved distribution of the at least one tissue parameter in the examination region. The content of the tissue parameter map is determined by way of example such that an appropriate database signal characteristic of the number of database signal characteristics is ascertained for the magnetic resonance signal characteristic. The appropriate database signal characteristic has in particular the greatest accord with the magnetic resonance signal characteristic. A database value of the at least one tissue parameter linked to the appropriate database signal characteristic can then be included in the tissue parameter map.

This method can be repeated for each magnetic resonance signal characteristic of the various voxels of the magnetic resonance images, resulting in a spatially resolved distribution of the at least one tissue parameter. The tissue parameter map can then be output in a further method step 42 on the display unit 25 and/or be stored in the database.

The method steps of the inventive method illustrated in FIGS. 2 to 3 are executed by the arithmetic processor 24. For this purpose, the arithmetic processor 24 comprises the required software and/or computer programs which are stored in a memory unit of the arithmetic processor 24. The software and/or computer programs comprise program means which are configured to carry out the inventive method when the computer program and/or the software is run in the arithmetic processor 24 by means of a processor unit of the arithmetic processor 24.

Figure 4:
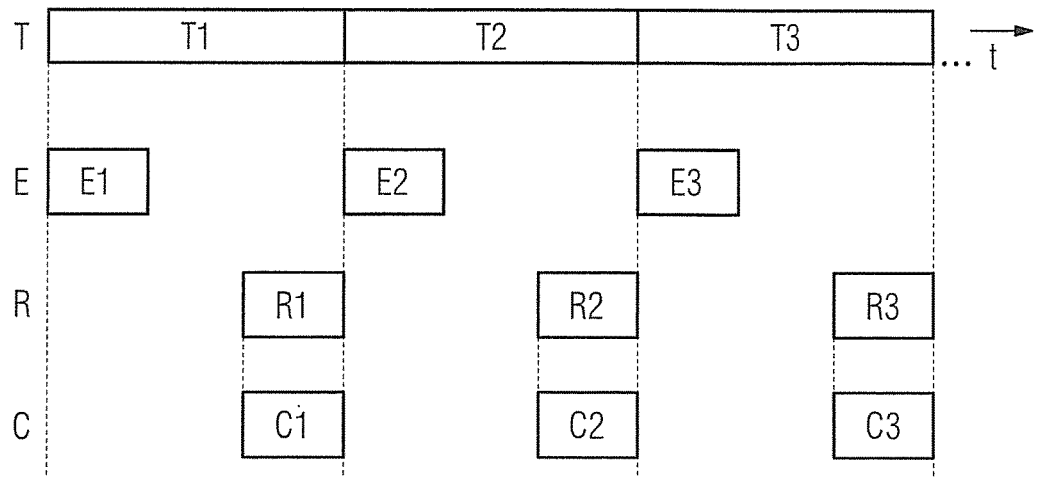
FIG. 4 illustrates a magnetic resonance sequence used in a third embodiment of the inventive method.
Figure 5:
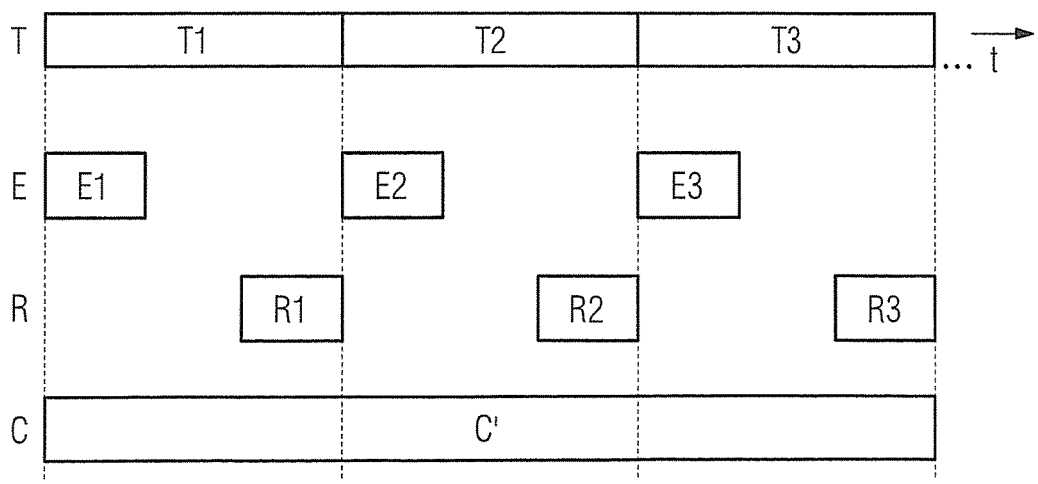
FIG. 5 illustrates a magnetic resonance sequence used in a fourth embodiment of the inventive method.

FIG. 4 shows a magnetic resonance sequence used in a third embodiment of the inventive method. FIG. 5 shows a magnetic resonance sequence used in a fourth embodiment of the inventive method.

The sequences shown in FIG. 4 and FIG. 5 should only be regarded as examples and represent one possibility of how a sequence over time of the magnetic resonance sequence could look. Reference should also be made to the fact that the sequence plans shown in FIG. 4 and FIG. 5 are incomplete since, for example, the spatial encoding gradients and readout windows are not shown. The sequence plans shown in FIG. 4 and FIG. 5 are also illustrated in an abstract manner. This means, only the chronology of sequence elements over time is shown and the exact formation of the sequence elements is not dealt with in detail. In the sequence plans shown in FIG. 4 and FIG. 5 time windows are in each case plotted on different time lines one above the other, in which windows the repetition intervals T, radio-frequency excitation pulses E, refocusing gradient R and compensation gradient C occur. In the sequence plans scaling in the time direction occurs only in arbitrary units for the purpose of simplification.

Both sequences as examples have three repetition intervals T1, T2, T3 of the magnetic resonance sequence. Of course, these repetition intervals T1, T2, T3 represent only a section of the magnetic resonance sequence. The magnetic resonance sequence will typically have more repetition intervals T for recording the magnetic resonance image data.

Each repetition interval T1, T2, T3 begins with a radio-frequency excitation pulse E1, E2, E3. At the end of each repetition interval T1, T2, T3 there is a refocusing of spins in the examination region by means of refocusing gradient R1, R2, R3.

Interference, caused by a magnetic interference field, to the refocusing of the spins in the examination region is at least partially compensated by compensation gradients C1, C2, C3, C'. The compensation gradients C1, C2, C3, C' are switched during at least part of the duration of recording of the magnetic resonance image data. The compensation gradients C1, C2, C3, C' are opposed to the magnetic interference field.

In the exemplary embodiment shown in FIG. 4 the compensation gradients C1, C2, C3 are switched for refocusing the spins in the examination region at the end of each repetition interval T1, T2, T3. In this way the compensation gradients C1, C2, C3 shown in the exemplary embodiment in FIG. 4 are only switched during the refocusing gradients R1, R2, R3. A first compensation gradient C1 of a first repetition interval Ti therefore occurs during a first refocusing gradient R1 of the first repetition interval T1. A second compensation gradient C2 of a second repetition interval T2 therefore occurs during a second refocusing gradient R2 of the second repetition interval T2. A third compensation gradient C3 of a third repetition interval T3 therefore occurs during a third refocusing gradient R3 of the third repetition interval T3.

In the exemplary embodiment shown in FIG. 5 a compensation gradient C' is switched for the entire duration of recording of the magnetic resonance image data. In this way the compensation gradient C' according to FIG. 5 is switched not just during the refocusing gradients R1, R2, R3, but also for the remaining duration of the multiple repetition intervals T1, T2, T3.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for magnetic resonance imaging, comprising:
operating a magnetic resonance scanner to acquire magnetic resonance data from an examination region of an examination subject situated in the magnetic resonance scanner, by executing a magnetic resonance data acquisition sequence comprising a plurality of repetition intervals and refocusing of nuclear spins in the examination region at an end of each repetition interval, said magnetic resonance data acquisition sequence being executed while an interference object produces a magnetic interference field in said examination region that disrupts said refocusing, said magnetic interference field having an amplitude;

operating said magnetic resonance scanner to counteract said disruption of said focusing caused by said magnetic interference field by activating, during an entirety of a duration of acquisition of said magnetic resonance raw data, a magnetic compensation gradient that is opposed to said magnetic interference field and that has a compensation gradient moment that at least partially compensates a time integral of the amplitude of said magnetic interference field; and compiling the magnetic resonance raw data in a memory and, via a computer, making the compiled magnetic resonance raw data available from said memory as a data file in electronic form.

2. A method as claimed in claim 1 comprising operating said magnetic resonance scanner with a steady-state free-precession (SSFP) magnetic resonance sequence as said magnetic resonance data acquisition sequence.

3. A method as claimed in claim 1 comprising operating said magnetic resonance scanner with a quantitative magnetic resonance method embodying said magnetic resonance data acquisition sequence.

4. A method as claimed in claim 1 comprising activating said compensation gradient during the refocusing of the nuclear spins in the examination region at each end of each of repetition interval.

5. A method for magnetic resonance imaging, comprising:
operating a magnetic resonance scanner to acquire magnetic resonance data from an examination region of an examination subject situated in the magnetic resonance scanner, by executing a magnetic resonance data acquisition sequence comprising a plurality of repetition intervals and refocusing of nuclear spins in the examination region at an end of each repetition interval by activating a refocusing gradient that produces a phase development of the nuclear spins in the examination region, said magnetic resonance data acquisition sequence being executed while an interference object produces a magnetic interference field in said examination region that disrupts said refocusing, said magnetic interference field having an amplitude:

operating said magnetic resonance scanner to counteract said disruption of said focusing caused by said magnetic interference field by activating, during said refocusing gradient in addition to said refocusing gradient, a magnetic compensation gradient that is opposed to said magnetic interference field and that has a compensation gradient moment that at least partially compensates a time integral of the amplitude of said magnetic interference field: and compiling the magnetic resonance raw data in a memory and, via a computer, making the compiled magnetic resonance raw data available from said memory as a data file in electronic form.

6. A method as claimed in claim 5 comprising activating said compensation gradient with compensation gradient parameters that are determined dependent on parameters of said refocusing gradient.

7. A method as claimed in claim 3 comprising operating said magnetic resonance scanner with a magnetic resonance fingerprinting method, as said quantitative magnetic resonance method, wherein, during each repetition interval, magnetic resonance raw data for an individual magnetic resonance image are acquired and, in said computer, determining a magnetic resonance signal characteristic from each magnetic resonance image for each respective repetition interval, and making a signal comparison of said signal characteristic with a plurality of database signal characteristics stored in a database that is accessible by said computer, to identify tissue represented in each individual magnetic resonance image as a result of the comparison.

8. A method as claimed in claim 1 comprising operating said magnetic resonance scanner, before acquiring said magnetic resonance raw data, to acquire adjustment data, and setting parameters of said magnetic compensation gradient dependent on said adjustment data.

9. A method as claimed in claim 1 comprising operating said magnetic resonance scanner in said magnetic data acquisition sequence to emit radiofrequency excitation pulses that excite said nuclear spins with an excitation frequency, and selecting said excitation frequency to match a resonance frequency of nuclear spins in a vicinity of said interference object.

10. A magnetic resonance apparatus comprising:
a magnetic resonance data acquisition scanner;
a computer configured to operate said magnetic resonance data acquisition scanner to acquire magnetic resonance data from an examination region of an examination subject situated in the magnetic resonance scanner, by executing a magnetic resonance data acquisition sequence comprising a plurality of repetition intervals and refocusing of nuclear' spins in the examination region at an end of each repetition interval, said magnetic resonance data acquisition sequence being executed while an interference object produces a magnetic interference field in said examination region that disrupts said refocusing, said magnetic interference field having an amplitude;

said computer being configured to operate said magnetic resonance data acquisition scanner to counteract said disruption of said focusing caused by said magnetic interference field by activating, during an entirety of a duration of acquisition of said magnetic resonance raw data, a magnetic compensation gradient that is opposed to said magnetic interference field and that has a compensation gradient moment that at least partially compensates a time integral of the amplitude of said magnetic interference field; and said computer being configured to compile the magnetic resonance raw data in a memory, and to make the compiled magnetic resonance raw data available from said memory as a data file in electronic form.

11. A non-transitory, computer-readable data storage medium encoded with programming instructions, said storage medium being loaded into a control computer of a magnetic resonance apparatus that comprising a magnetic resonance data acquisition scanner, said programming instructions causing said control computer to:
operate said magnetic resonance data acquisition scanner to acquire magnetic resonance data from an examination region of an examination subject situated in the magnetic resonance scanner, by executing a magnetic resonance data acquisition sequence comprising a plurality of repetition intervals and refocusing of nuclear spins in the examination region at an end of each repetition interval, said magnetic resonance data acquisition sequence being executed while an interference object produces a magnetic interference field in said examination region that disrupts said refocusing, said magnetic interference field having an amplitude;

operate said magnetic resonance data acquisition scanner to counteract said disruption of said focusing caused by said magnetic interference field by activating, an entirety of a duration of acquisition of said magnetic resonance raw data, a magnetic compensation gradient that is opposed to said magnetic interference field and that has a compensation gradient moment that at least partially compensates a time integral of the amplitude of said magnetic interference field; and compile the magnetic resonance raw data in a memory, and make the compiled magnetic resonance raw data available from said memory as a data file in electronic form.

12. A magnetic resonance apparatus comprising:

a magnetic resonance data acquisition scanner;

a computer configured to operate said magnetic resonance data acquisition scanner to acquire magnetic resonance data from an examination region of an examination subject situated in the magnetic resonance scanner, by executing a magnetic resonance data acquisition sequence comprising a plurality of repetition intervals and refocusing of nuclear spins in the examination region at an end of each repetition interval, by activating a refocusing gradient that produces a phase development of the nuclear spins in the examination region, said magnetic resonance data acquisition sequence being executed while an interference object produces a magnetic interference field in said examination region that disrupts said refocusing, said magnetic interference field having an amplitude;

said computer being configured to operate said magnetic resonance data acquisition scanner to counteract said disruption of said focusing caused by said magnetic interference field by activating, during the refocusing gradient in addition to the refocusing gradient, a magnetic compensation gradient that is opposed to said magnetic interference field and that has a compensation gradient moment that at least partially compensates a time integral of the amplitude of said magnetic interference field; and said computer being configured to compile the magnetic resonance raw data in a memory, and to make the compiled magnetic resonance raw data available from said memory as a data file in electronic form.

13. A non-transitory, computer-readable data storage medium encoded with programming instructions, said storage medium being loaded into a control computer of a magnetic resonance apparatus that comprising a magnetic resonance data acquisition scanner, said programming instructions causing said control computer to:

operate said magnetic resonance data acquisition scanner to acquire magnetic resonance data from an examination region of an examination subject situated in the magnetic resonance scanner, by executing a magnetic resonance data acquisition sequence comprising a plurality of repetition intervals and refocusing of nuclear spins in the examination region at an end of each repetition interval, by activating a refocusing gradient that produces a phase development of the nuclear spins in the examination region, said magnetic resonance data acquisition sequence being executed while an interference object produces a magnetic interference field in said examination region that disrupts said refocusing, said magnetic interference field having an amplitude;

operate said magnetic resonance data acquisition scanner to counteract said disruption of said focusing caused by said magnetic interference field by activating, during the refocusing gradient in addition to the refocusing gradient, a magnetic compensation gradient that is opposed to said magnetic interference field and that has a compensation gradient moment that at least partially compensates a time integral of the amplitude of said magnetic interference field; and compile the magnetic resonance raw data in a memory, and make the compiled magnetic resonance raw data available from said memory as a data file in electronic form.

* * * * *